United States Patent
Lu

(10) Patent No.: US 9,800,214 B2
(45) Date of Patent: Oct. 24, 2017

(54) POWER SUPPLY REJECTION RATE THROUGH NOISE CANCELLATION IN AN AUDIO AMPLIFIER LOOP

(71) Applicant: QUALCOMM Incorporated, San Diego, CA (US)

(72) Inventor: Jingxue Lu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 46 days.

(21) Appl. No.: 14/673,613

(22) Filed: Mar. 30, 2015

(65) Prior Publication Data

US 2016/0294337 A1 Oct. 6, 2016

(51) Int. Cl.
*H03F 3/217* (2006.01)
*H03F 3/183* (2006.01)
*H03F 1/02* (2006.01)
*H04B 15/00* (2006.01)

(52) U.S. Cl.
CPC ........... *H03F 3/183* (2013.01); *H03F 1/0211* (2013.01); *H03F 3/217* (2013.01); *H04B 15/005* (2013.01); *H03F 3/2171* (2013.01); *H03F 2200/03* (2013.01); *H03F 2200/351* (2013.01)

(58) Field of Classification Search
CPC ......... H03F 3/183; H03F 1/0211; H03F 3/217
USPC ....................... 330/10, 207 A, 251
See application file for complete search history.

(56) References Cited

U.S. PATENT DOCUMENTS

| 4,195,267 A * | 3/1980 | Stanley | H03F 1/3217 330/149 |
|---|---|---|---|
| 5,661,435 A * | 8/1997 | Coleman | H03F 1/083 330/107 |
| 6,914,435 B2 * | 7/2005 | Graham | G01R 23/20 324/500 |
| 7,002,406 B2 | 2/2006 | Risbo et al. | |
| 7,038,534 B2 | 5/2006 | Hanzlik | |
| 7,183,842 B1 * | 2/2007 | Wai | H03F 3/68 330/85 |

(Continued)

OTHER PUBLICATIONS

Colli-Menchi A.I., et al., "A Feed-Forward Power-Supply Noise Cancellation Technique for Single-Ended Class-D Audio Amplifiers," IEEE Journal of Solid-State Circuits, Mar. 2014, vol. 49 (3), pp. 718-728.

(Continued)

*Primary Examiner* — Khanh V Nguyen
(74) *Attorney, Agent, or Firm* — Loza & Loza, LLP/Qualcomm

(57) ABSTRACT

Embodiments contained in the disclosure provide a method of cancelling power supply noise that affects the output of a class-D audio amplifier. The method begins when an alternating current (AC) coupled signal is input into an inverting amplifier. That signal is then amplified in the inverting amplifier. The amplified AC coupled signal is then feed through a resistor capacitor (RC) network, and from the RC network to an inverting input of the inverting amplifier. The output of a high pass filter is used to cancel the power supply ripple signal as the output of the high pass filter is injected into a supply voltage line. The cancelling signal is opposite in magnitude to the power supply ripple signal. The apparatus includes an inverting amplifier, a capacitor for coupling to an AC signal, and a resistor, in combination with the capacitor.

21 Claims, 5 Drawing Sheets

(56) References Cited

U.S. PATENT DOCUMENTS

| | | |
|---|---|---|
| 8,503,453 B2 | 8/2013 | Asati et al. |
| 8,766,713 B2 | 7/2014 | Lin |
| 8,957,728 B2 * | 2/2015 | Gorisse .................... H03F 1/34 330/136 |
| 2005/0162222 A1 | 7/2005 | Hezar et al. |
| 2008/0190203 A1 * | 8/2008 | Sugimori ................. H03F 1/02 330/75 |
| 2010/0109768 A1 | 5/2010 | Kotowski et al. |
| 2010/0254544 A1 * | 10/2010 | Kimura ............... H04B 15/005 381/94.1 |
| 2011/0255228 A1 * | 10/2011 | Kimura ................... G01D 5/24 330/307 |
| 2014/0266422 A1 * | 9/2014 | Rievers .................... H03F 1/00 330/75 |

OTHER PUBLICATIONS

International Search Report and Written Opinion—PCT/US2016/022488—ISA/EPO—Jun. 3, 2016.

\* cited by examiner

POWER SUPPLY REJECTION RATE THROUGH NOISE CANCELLATION IN AN AUDIO AMPLIFIER LOOP

FIELD

The present disclosure relates generally to power supplies, and more particularly, to improving power supply rejection rate using noise cancellation in a class-D audio amplifier loop.

BACKGROUND

Mobile devices incorporate an audio amplifier to allow a user to listen to a conversation or enjoy a musical program or audio book. Many mobile devices use a class-D audio amplifier as part of the audio circuit. This class-D audio amplifier incorporates two complementary metal-oxide silicon (CMOS) transistors that are biased on or off These CMOS transistors generate a digital output which is about ten times the highest frequency of the speaker. The speaker acts as a low pass filter in the audio circuit. The pulse modulation out of the class-D amplifier is the digital component and is filtered out by the speaker.

Most mobile devices incorporate a power supply to power the device and also to provide power for the audio amplifier circuit. The power supply generates noise in the course of generating power and this noise resides inside the low pass filter, or speaker passband. As a result the listener hears this noise through the speaker. This noise is a low pass filtered analog output.

The class-D switching amplifier suffers from poor power supply rejection ration (PSRR). This means that the noise present at the speaker is more likely to occur. PSRR is typically limited by matching the feedback resistors. However, improving matching of the feedback resistors requires increasing the area, which may not be possible on the die, as many functions must be provided and the area for matching may be less than needed to provide the best sound quality.

A further challenge to improving PSRR and providing better sound quality is that the matching required and hence the specific resistors needed varies with the process being studied. There is a need in the art for a compact circuit for cancelling power supply noise for a class-D audio amplifier utilizing a multiple feedback loop.

SUMMARY

Embodiments contained in the disclosure provide a method of cancelling power supply noise that affects the output of a class-D audio amplifier. The method begins when an alternating current (AC) coupled signal is input into an inverting amplifier. That signal is then amplified in the inverting amplifier. The amplified AC coupled signal is then feed through a resistor capacitor (RC) network, and from the RC network to an inverting input of the inverting amplifier. The output of a high pass filter is used to cancel the power supply ripple signal as the output of the high pass filter is injected into a supply voltage line. The cancelling signal is opposite in magnitude to the power supply ripple signal.

A further embodiment provides an apparatus for noise cancellation. The apparatus consists of an inverting amplifier, a capacitor for coupling to an AC signal, and a resistor in combination with the capacitor. The combination of the capacitor and resistor forms a low pass filter.

A still further embodiment provides an apparatus for noise cancellation. The apparatus comprises: means for inserting an alternating current (AC) coupled signal into an inverting amplifier; means for amplifying the AC coupled signal; means for feeding the amplified AC coupled signal to a resistor capacitor (RC) network; means for feeding the AC coupled signal output from the RC network to an inverting input of the inverting amplifier; and means for cancelling power supply ripple by injecting an output of a high pass filter into a supply voltage line.

A yet further embodiment provides a non-transitory computer readable media that includes program instructions, which when executed by a processor cause the processor to perform a method comprising the steps of: inserting an alternating current (AC) coupled signal into an inverting amplifier; amplifying the AC coupled signal; feeding the amplified AC coupled signal to a resistor capacitor (RC) network; feeding the AC coupled signal output from the RC network to an inverting input of the inverting amplifier; and cancelling power supply ripple by injecting an output of a high pass filter into a supply voltage input line.

DETAILED DESCRIPTION

Figure 1:
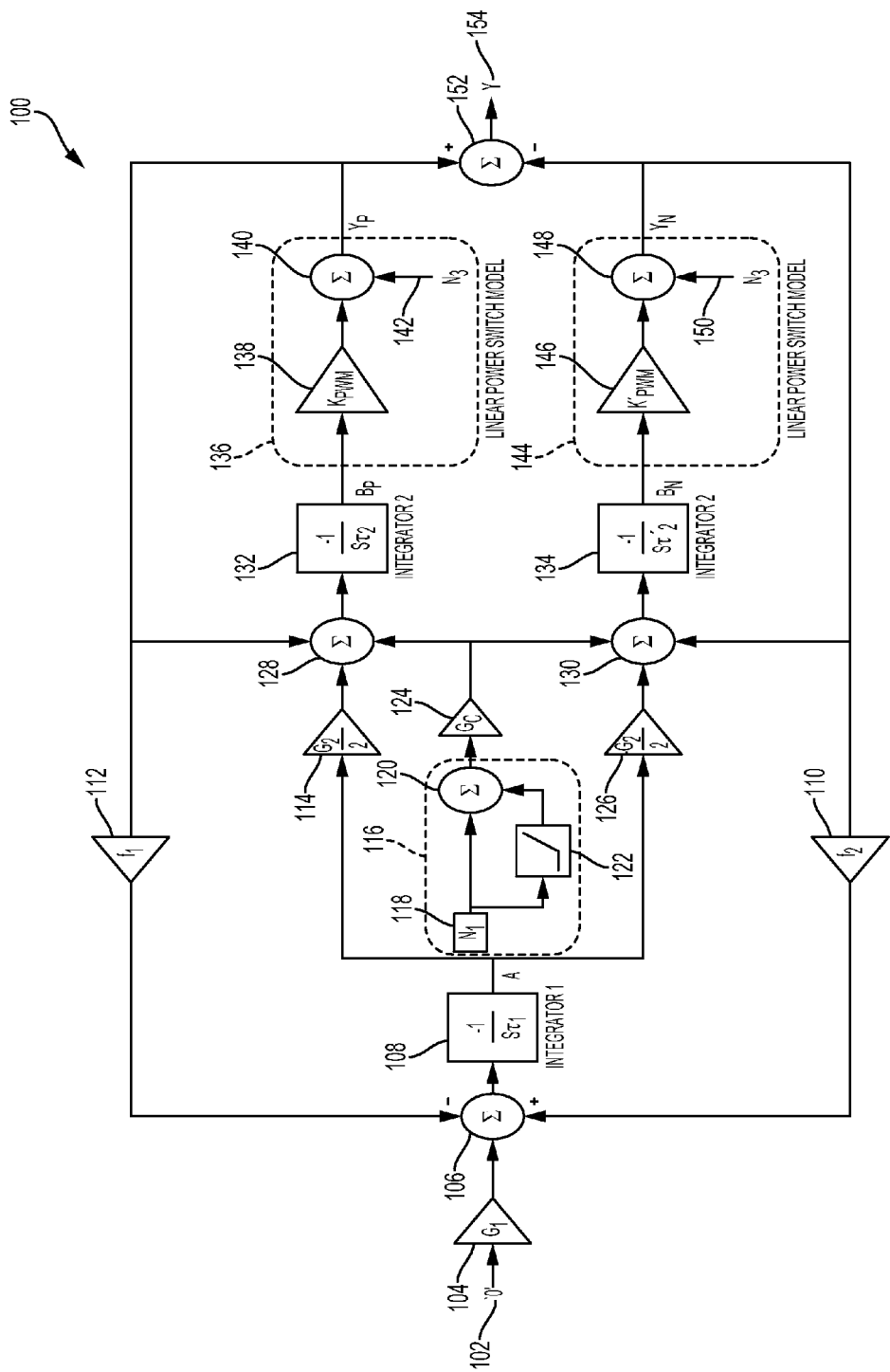
FIG. 1 is a block diagram of an apparatus for power supply noise cancellation in a class-D audio amplifier loop using a low pass filter, according to an embodiment disclosed herein.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As used in this application, the terms "component," "module," "system," and the like are intended to refer to a computer-related entity, either hardware, firmware, a combination of hardware and software, software, or software in execution. For example, a component may be, but is not limited to being, a process running on a processor, an integrated circuit, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network, such as the Internet, with other systems by way of the signal).

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ), and integrated circuits such as read-only memories, programmable read-only memories, and electrically erasable programmable read-only memories.

Various aspects will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

Other aspects, as well as features and advantages of various aspects, of the present invention will become apparent to those of skill in the art through consideration of the ensuring description, the accompanying drawings and the appended claims.

Class-D audio amplifiers generally have two CMOS transistors that are biased on or off These transistors generate a digital output, which may be about ten times the highest frequency of the speaker. The speaker may receive noise present on signals passed to the speaker. Power supplies may generate noise that is passed through to the speaker. A listener may hear this low pass filtered analog output due to the poor power supply rejection ratio. This noise is audible to a listener because the power supply noise is inside the low pass filter/speaker passband. For improved audio for a listener, this noise should be removed.

One method to try to remove the noise from the speaker passband uses matching feedback resistors to cancel the noise component. Improving the matching of these feedback resistors may require multiple resistors to handle various needs and processes performed by the device. As a result, the die area occupied by the feedback resistors may increase to an unacceptable level. Previously, in a class-D audio amplifier two feedback resistor loops were utilized. The first feedback loop acted as the main feedback loop. The resistors incorporated into the first feedback loop are typically mismatched. The second resistor loop is used to setup the common mode for outputs. Supply noise leaks out through the mismatch of the feedback network if there is common mode noise at the outputs.

Embodiments described here provide a novel and compact circuit to cancel power supply noise for a class-D audio amplifier. The embodiments utilize a multiple feedback loop to accomplish the noise cancellation. The embodiments described herein use a high pass filter to create a negative supply ripple, which neutralizes the power supply ripple at a critical bias point and does not disturb normal class-D amplifier operation.

In electronics, power supply rejection ratio (PSRR) may be used to describe the amount of noise from a power supply that a particular device can reject. PSRR is defined as the ratio of the change in supply voltage in the operational-amplifier (op-amp) to the equivalent (differential) output voltage it produces. It may be expressed in decibels (dB). An ideal op-amp would have infinite PSRR. In actuality, the output voltage depends on the feedback circuit, as is the case for regular input offset voltages. However, testing is not confined to direct current (DC), zero frequency, as in many cases an op-amp will have PSRR measured at various frequencies. In such cases, the PSRR uses the ratio of one of the root-mean-square (RMS) amplitude of sine waves present at a power supply connected with the output, with gain factored in. Unwanted oscillation, which may include motorboating, may occur when an amplifying stage is too sensitive to signals fed into the power supply from a later power amplifier stage. If the power supply of an op-amp changes, it output should not change. However, the output typically does change. If a change of X volts in the supply produces an output voltage change of Y volts, then the PSRR of that power supply, the output, is X/Y. This dimensionless ratio is the PSRR. PSRR may be referred to either as output (RTO) or input (RTI). The RTI value may be obtained by dividing the RTO value by the amplifier gain, G. In the case of a traditional op-amp, this G is the noise gain.

PSRR may be positive or negative, and tends to worsen with increasing frequency. If an amplifier has dual power supplies, it is typical to express PSRR separately for each power supply. PSRR is very much a function of ripple or noise frequency. In most cases, the corner frequency of the roll-off follows that of the open-loop gain, and the slope is approximately 6 dB per octave (20 dB per decade).

Amplifiers are found in many electronic devices today. Mobile phones require amplifiers to provide usable sound quality. Increasingly, other devices incorporate amplifiers as well, such as: laptop computers, desktop computers, tablet devices, personal devices, and wireless speakers for use with many of the previously named devices.

FIG. 1 illustrates a digital class-D amplifier with a noise cancelling power supply filter. The power supply low pass filter will be shown inserted into the first stage of the digital power amplifier in the detailed discussion following. The assembly 100 includes the components discussed below. An unamplified audio signal 102 is input to a current amplifier 104 (labeled G1). Current amplifier 104 amplifies the current and send an input signal into a signal summing network 106.

Signal summing network 106 also receives inputs from feedback amplifier 110 (f2) and feedback amplifier 112 (f1). The resulting summed signal from signal summing network 106 is sent to an integrator 108. From integrator 108 the signal is passed to first stage positive digital amplifier 114 and a first stage negative digital amplifier 126.

An inverting class-D amplifier stage 1 126 also receives input from integrator 108. Power supply noise cancelling filter includes a power supply input 118, a summing network 120, an inverting high-pass filter 122. The signal passes through inverted class-D amplifier stage 1 126 and is output to a current amplifier 124. Current amplifier 124 provides input signal to a positive digital amplifier summing network 128 and a negative digital amplifier summing network 130. From this point forward the positive and negative networks have similar components and functions, but opposite signals.

The output of positive summing network 128 is input to positive digital amplifier integrator 132, while the output of negative summing network 130 is input to negative amplifier integrator 134. The signal from positive amplifier integrator 132 is input to a second stage positive amplifier power switch module 136. Second stage positive amplifier power switch module 136 includes second stage positive amplifier 138 and positive amplifier power supply noise cancelling summer 140. Positive digital amplifier power supply noise cancelling summer 140 receives power supply input 142.

The signal from negative amplifier integrator 134 is input to second stage negative amplifier power switch module 144. Like the positive second stage described above, negative amplifier power switch module 144 includes second stage negative amplifier 146 and negative amplifier power supply noise cancelling summer 148. Negative amplifier power supply noise cancelling summer 148 receives power supply input 150.

The output from both the positive and negative amplifier switch modules 136 and 144 are input to a second stage amplifier summing network 152. The second stage amplifier summing network 152 provides amplifier output 154.

Figure 2:
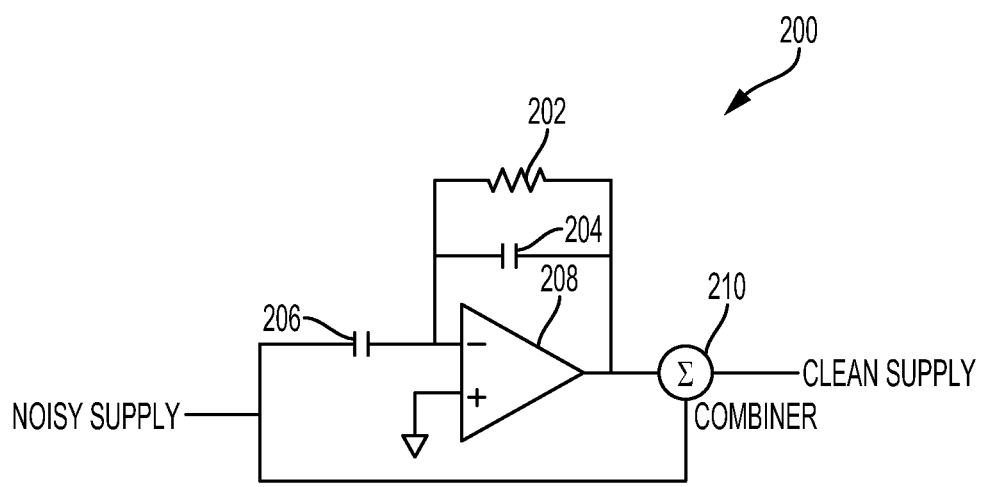
FIG. 2 is a block diagram of a low pass filter for power supply noise cancellation in a class-D audio amplifier loop, according to an embodiment described herein.

FIG. 2 depicts a noise cancellation filter assembly 200. Noise cancellation assembly 200 includes low pass filter feedback resistor 202 and low pass filter feedback capacitor 204. A DC blocking capacitor 206 is installed before an inverting amplifier. Inverting amplifier 208 acts as the high pass filter inverting amplifier. The output of inverting amplifier 208 and feedback resistor 202 and feedback capacitor 204 are input to noisy power supply noise cancelling summing network 210.

In operation a noisy power supply signal is injected into the first input of the summing network. The inverted high pass filter signal exiting from high pass filter inverting amplifier 208 is injected into the second input of the summing network 210. The output of summing network 210 prevents or cancels noise from the power supply signal.

Figure 3:
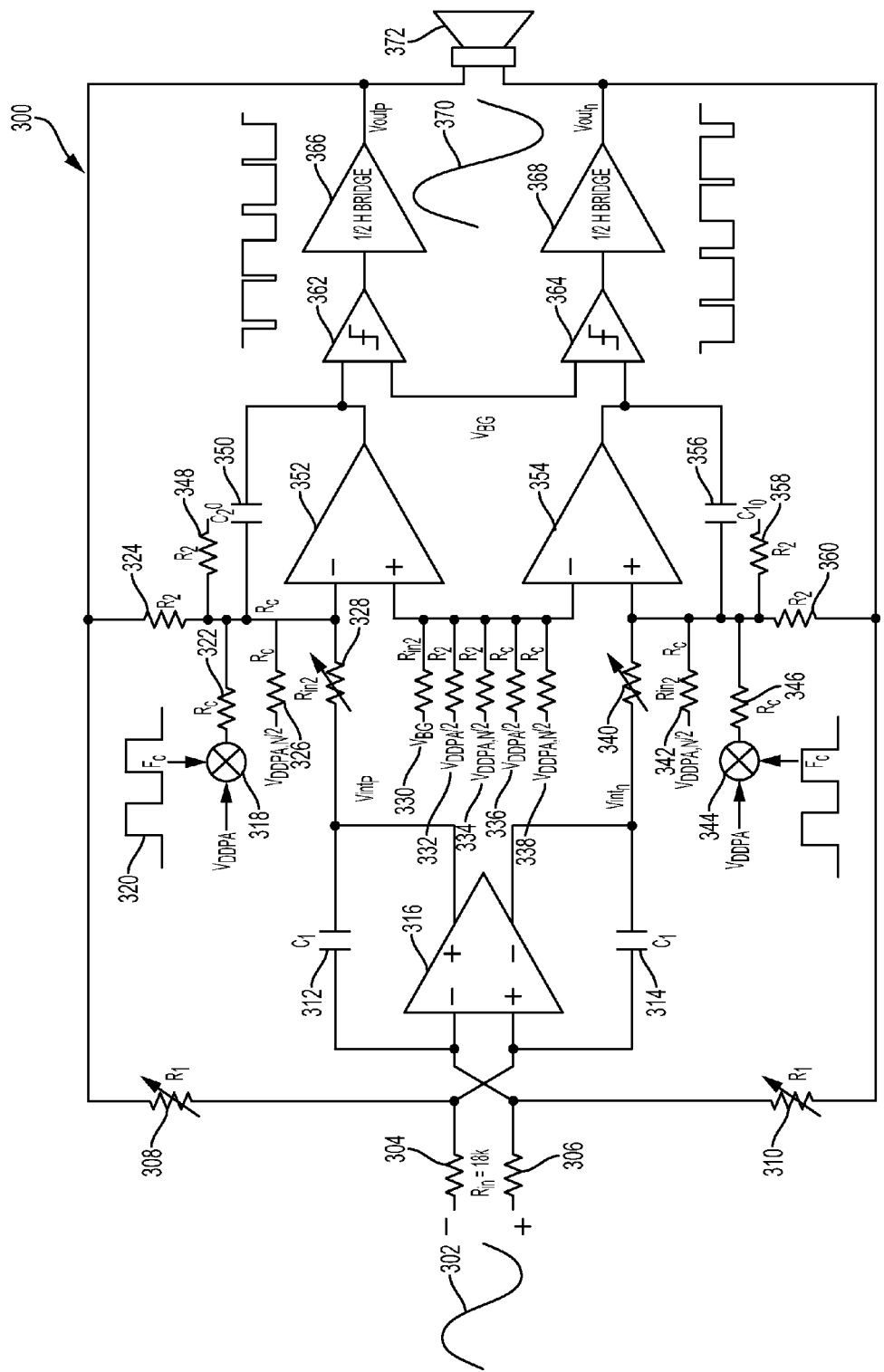
FIG. 3 is a block diagram of an apparatus for power supply noise cancellation in a class-D audio amplifier loop, using a high pass filter, in accordance with a further embodiment described herein.

FIG. 3 is a diagram of a class-D audio amplifier with a summation network for noise cancellation filtering in accordance with embodiments discussed herein. The summing network is comprised of resistors 348, 326, 334, 338, and 342. The assembly 300 is shown receiving an input signal 302. This input signal is input on negative input resistor 304 and positive input resistor 306. From input resistors 304 and 306 the signal passes through a negative feedback resistor 308 and a positive feedback resistor 310. Both feedback resistor 310 and feedback resistor 308 are adjustable resistors. Coupled to the input signal lines are capacitors 312 and 314, with each line having a capacitor in the input. The combined input from the signal lines and capacitors 312 and 314 is input to the inputs of amplifier 316.

Both the signal paths include a mixer, with mixer 318 on one signal path and mixer 344 on the other signal path. Both mixers 318 and 320 receive a square wave signal input as illustrated. For both the signal paths, the signal output from the mixers 320 and 344 is passed through a resistor, in the case of mixer 318, the output signal passes through resistor 322. For mixer 344, the output signal passes through resistor 346.

The signals exiting from amplifier 316 pass through adjustable resistors 328 for one side and 340 for the other side. Feeding into the output signals from the amplifier are resistors 324 for one side and 360 for the other side. These signals are input with signals from resistors 326 and 348 for one side. Resistor 326 acts as part of the noise cancelling apparatus to inject negative high pass filter supply noise signals. Resistor 348 is linked to system ground. For the other signals, this function is provided by resistors 342 and 358. Resistor 342 also injects the high pass supply noise signal, while resistor 358 is connected to system ground. Additional control is provided by resistor 328, which is an adjustable resistor on one signal side. Similarly, resistor 340 is an adjustable resistor on the other signal side.

The signals that are output from adjustable resistors 328 and 340 are input into amplifiers, one for each signal. One set of signals are input from adjustable resistor 328 into amplifier 352 on one input. The signals from adjustable resistor 340 are input into amplifier 352 on the other input. For amplifier 352, one input receives input from resistors 330, 332, 334, 336, and 338. Resistors 330, 332, 334, 336, and 338 also provide input to the other side of amplifier 354. Resistors 334 and 338 are used to inject a high pass filter power supply noise signal into both amplifiers 352 and 354.

The signals output from amplifiers 352 and 354 are input to inverting amplifiers. Amplifier 362 receives the one signal side, along with input through capacitor 350. Amplifier 364 receives the other signal side, along with input through capacitor 356. Each amplifier 362 and 364 sends an output signal to a bridge amplifier. Both bridge amplifiers are half height amplifiers, with bridge amplifier 366 receiving the signal output from inverting amplifier 362 and bridge amplifier 368 receiving the signal output from inverting amplifier 364. At this stage, the output signal 370 is clear of undesirable noise and is input to speaker 372.

In operation, the high pass filter is used to generate power supply noise that is equal and opposite to the power supply noise. A simple resistor network is used to achieve the summation. Resistors 326, 334, 338, 342, 348 and 358 are used to feed the signal noise into the class-D amplifiers. When this signal noise is fed into the amplifiers, it cancels the power supply noise. As a result, output common mode noise is filtered and the power supply rejection rate is improved. More specifically, the power supply noise, or ripple, passes through resistors 330, 332, and 336, while the opposite ripple is generated through resistors 334 or 336 and 338. This high pass filter power supply noise signal is injected into the power supply line for the second stage class-D amplifier, thus reducing the power supply ripple noise.

Figure 4:
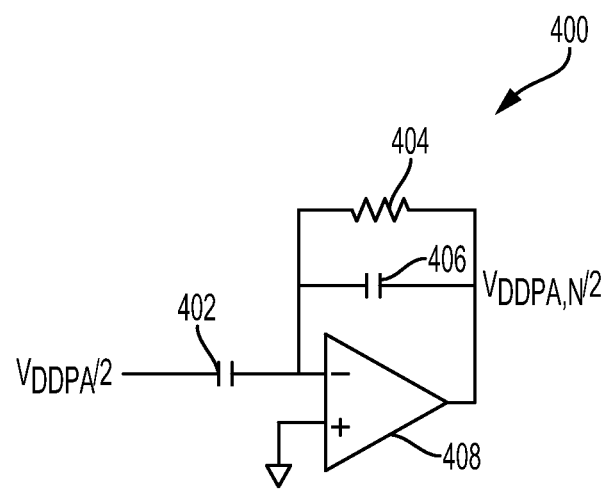
FIG. 4 provides a block diagram of a high pass filter in a class-D audio amplifier loop for power supply noise cancellation, according to a further embodiment described herein.

FIG. 4 is a block diagram of a high pass filter as described above. The assembly 400 includes DC blocking capacitor 402. Capacitor 402 serves as a blocking capacitor to inverting amplifier 408 on one input. The input also receives input from high pass filter resistor 404 and high pass filter capacitor 406. The output from the high pass inverting amplifier is the power supply ripple.

The method of FIG. 4 uses the following formula to compute the power supply rejection ratio:

$$PSRR = \frac{2(f2 - f1)(G_C N_1)}{f1 + f2}$$

Where f1 and f2 are the feedback factors shown in FIG. 1, and $N_1$ is the power supply noise from the bias generation, which does not include the power supply stage noise. The formula above may be used for calculating power supply rejection ratio without noise cancellation.

Figure 5:
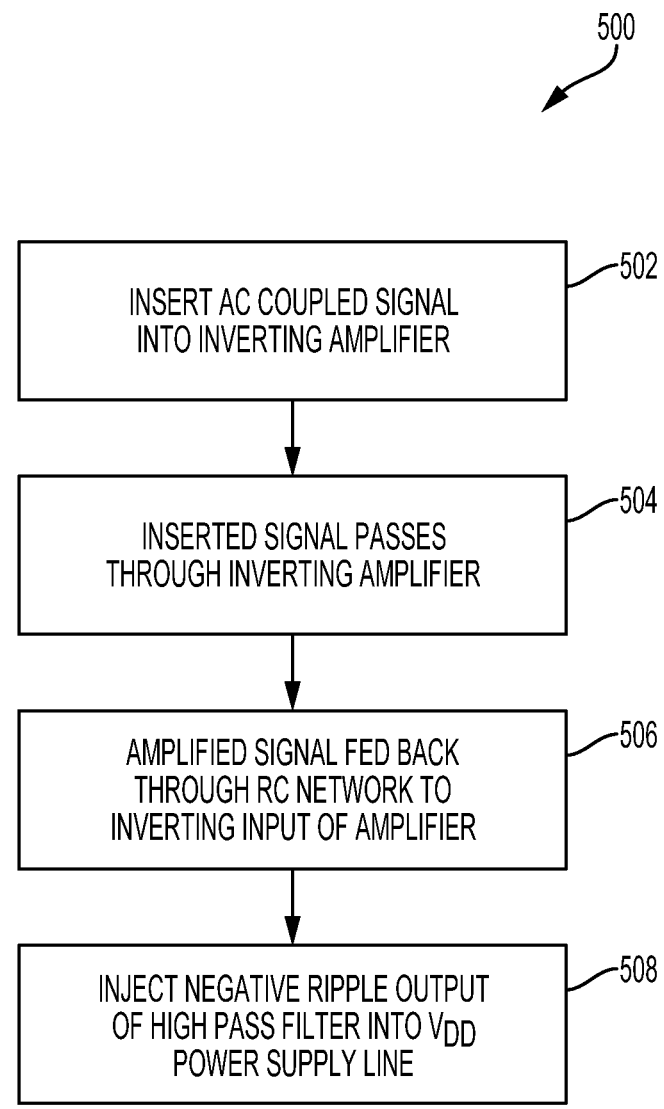
FIG. 5 is a flowchart of a method of supply noise cancellation in a multiple feedback class-D audio amplifier, in accordance with an embodiment described herein.

FIG. 5 is a flowchart of a method 500, for power supply noise cancellation in a multiple feedback class-D audio amplifier loop, in accordance with embodiments described herein. The method begins when an alternating current (AC) coupled signal is inserted into an inverting amplifier in step 502. This AC coupled signal is the power supply ripple noise that is to be cancelled. The signal then passes through the inverting amplifier in step 504. The resulting amplified signal is fed back through an RC filter network to the inverting input of the amplifier in step 506. The RC network creates the high pass filter (HPF). In step 508 a negative ripple output of the HPF is injected into the $V_{DD}$ power supply line. The $V_{DD}$ is the input voltage to the class-D amplifier. It is this input that cancels or significantly reduces the power supply ripple.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitter over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM EEPROM, CD-ROM or other optical disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A method of noise cancellation, comprising:
   inserting an alternating current (AC) coupled signal into an inverting amplifier;
   amplifying the AC coupled signal;
   feeding the amplified AC coupled signal to a resistor capacitor (RC) network;
   feeding the AC coupled signal output from the RC network to an inverting input of the inverting amplifier; and
   cancelling power supply ripple by injecting an output of a high pass filter into a supply voltage input line.

2. The method of claim 1, wherein the power supply ripple is in the pass band of a class-D amplifier.

3. The method of claim 2, wherein the power supply ripple is in an audible range.

4. The method of claim 1, wherein the cancelling power supply ripple signal is mixed with the power supply ripple signal and the cancelling power supply ripple signal is opposite in magnitude to the power supply ripple signal.

5. The method of claim 2, wherein a power supply ripple out of pass band component is ignored.

6. An apparatus for noise cancellation, comprising:
   an inverting amplifier configured to cancel power supply ripple by injecting an output of a high pass filter into a supply voltage input line;
   a capacitor for coupling an AC signal;
   a resistor in combination with the capacitor; and
   a combiner configured to combine a noisy power supply signal and an inverted signal of a high pass filter.

7. The apparatus of claim 6, wherein an input of the inverting amplifier is coupled to an output of the inverting amplifier through the resistor and capacitor.

8. The apparatus of claim 6, wherein the resistor and capacitor form a network.

9. The apparatus of claim 6, wherein the resistor and capacitor are selected to form a pass band of a high pass filter.

10. The apparatus of claim 9, wherein the pass band of a high pass filter is equivalent to an audio pass band of a class-D amplifier.

11. An apparatus for noise cancellation, comprising:
 means for inserting an alternating current (AC) coupled signal into an inverting amplifier;
 means for amplifying the AC coupled signal;
 means for feeding the amplified AC coupled signal to a resistor capacitor (RC) network;
 means for feeding the AC coupled signal output from the RC network to an inverting input of the inverting amplifier; and
 means for cancelling power supply ripple by injecting an output of a high pass filter into a supply voltage input line.

12. The apparatus of claim 11, wherein the means for cancelling power supply ripple cancels power supply ripple in a pass band of a class-D amplifier.

13. The apparatus of claim 12, wherein the means for cancelling power supply ripple cancels power supply ripple in an audible range.

14. The apparatus of claim 11, wherein the means for cancelling power supply ripple cancels power supply ripple by mixing the power supply ripple cancelling signal with the power supply ripple signal and the cancelling power supply ripple signal is opposite in magnitude to the power supply ripple signal.

15. The apparatus of claim 12, where the means for canceling power supply ripple ignores an out of pass band component of the power supply ripple signal.

16. A non-transitory computer readable media including program instructions which when executed by a processor cause the processor to perform a method of comprising the steps of:
 inserting an alternating current (AC) coupled signal into an inverting amplifier;
 amplifying the AC coupled signal;
 feeding the amplified AC coupled signal to a resistor capacitor (RC) network;
 feeding the AC coupled signal output from the RC network to an inverting input of the inverting amplifier; and
 cancelling power supply ripple by injecting an output of a high pass filter into a supply voltage input line.

17. The non-transitory computer readable media including the program instructions of claim 16, wherein the power supply ripple is in the pass band of a class-D amplifier.

18. The non-transitory computer readable media including the program instructions of claim 17, wherein the power supply ripple signal is within an audible range.

19. The non-transitory computer readable media including the program instructions of claim 16, wherein the cancelling power supply ripple signal is mixed with the power supply ripple signal and the cancelling power supply ripple signal is opposite in magnitude to the power supply ripple signal.

20. The non-transitory computer readable media including the program instructions of claim 17, wherein a power supply ripple signal out of pass band component is ignored.

21. The non-transitory computer readable media including the program instructions of claim 19, wherein the cancelling power supply ripple signal that is mixed with the power supply ripple signal is equal and opposite in magnitude to the power supply ripple signal.

* * * * *